United States Patent
Khokale et al.

(10) Patent No.: US 11,721,621 B2
(45) Date of Patent: Aug. 8, 2023

(54) STACKED FIELD-EFFECT TRANSISTORS WITH A SHIELDED OUTPUT

(71) Applicant: GlobalFoundries U.S. Inc., Malta, NY (US)

(72) Inventors: Shweta Vasant Khokale, Ballston Spa, NY (US); Kaustubh Shanbhag, Slingerlands, NY (US); Tamilmani Ethirajan, Guilderland, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 17/527,606

(22) Filed: Nov. 16, 2021

(65) Prior Publication Data

US 2023/0154844 A1    May 18, 2023

(51) Int. Cl.
*H01L 23/522* (2006.01)
*H01L 27/12* (2006.01)
*H01L 21/84* (2006.01)
*H01L 23/528* (2006.01)

(52) U.S. Cl.
CPC .......... *H01L 23/5225* (2013.01); *H01L 21/84* (2013.01); *H01L 23/5226* (2013.01); *H01L 23/5286* (2013.01); *H01L 27/1203* (2013.01)

(58) Field of Classification Search
CPC . H01L 23/5225; H01L 21/84; H01L 23/5226; H01L 23/5286; H01L 27/1203; H01L 23/528
USPC ............................................ 257/347; 438/149
See application file for complete search history.

(56) References Cited

U.S. PATENT DOCUMENTS

| 8,859,347 B2 | 10/2014 | Stuber et al. |
| 9,230,913 B1 | 1/2016 | Senapati et al. |
| 10,593,619 B1 | 3/2020 | Khalil et al. |
| 2009/0237186 A1 | 9/2009 | Onda et al. |
| 2010/0182078 A1 | 7/2010 | Cantoni |

(Continued)

OTHER PUBLICATIONS

Vandooren, A. et al., "Buried metal line compatible with 3D sequential integration for top tier planar devices dynamic V th tuning and RF shielding applications," 2019 Symposium on VLSI Technology, pp. T56-T57, doi: 10.23919/VLSIT.2019.8776490 (2019).

(Continued)

*Primary Examiner* — Thinh T Nguyen
(74) *Attorney, Agent, or Firm* — Thompson Hine LLP; Francois Pagette

(57) ABSTRACT

Structures including stacked field-effect transistors and methods of forming a structure including stacked field-effect transistors. The structure includes a field-effect transistor having a first active gate, a second active gate, and a drain region that is positioned in a horizontal direction between the first and second active gates. The structure further includes a back-end-of-line stack having a first metal level and a second metal level over the field-effect transistor. The first metal level includes a first interconnect, a second interconnect, and a third interconnect, and the second metal level includes a fourth interconnect. The third interconnect is connected to the drain region. The third interconnect is positioned in a vertical direction between the fourth interconnect and the drain region, and the third interconnect is positioned in the horizontal direction between the first and second interconnects.

20 Claims, 5 Drawing Sheets

(56) References Cited

U.S. PATENT DOCUMENTS

2015/0333051 A1    11/2015    Greenberg et al.
2020/0075479 A1*    3/2020    Khalil et al. ...... H01L 21/76802

OTHER PUBLICATIONS

Rice, D. et al., "HWFETtm: A New 0.25 um Channel Length RF Power Mosfet with Ultra Low Feedback Capacitance," The 5th European Microwave Integrated Circuits Conference, pp. 154-157 (2010).

Xu, Shuming et al., "RF LDMOS with Extreme Low Parasitic Feedback Capacitance and High Hot-Carrier Immunity," International Electron Devices Meeting. Technical Digest (Cat. No. 99CH36318); pp. 201-204; doi: 10.1109/IEDM.1999.823879 (1999).

Subramanian, V. et al., "On-chip Electromagnetic Interactions in CMOS Cascode LNAs," 2007 IEEE International Workshop on Radio-Frequency Integration Technology; pp. 240-243, doi: 10.1109/RFIT.2007.4443959 (2007).

Yeh, H. et al., "Analysis and Design of Millimeter-Wave Low-Voltage CMOS Cascode LNA With Magnetic Coupled Technique," in IEEE Transactions on Microwave Theory and Techniques, vol. 60, No. 12, pp. 4066-4079, doi: 10.1109/TMTT.2012.2224365 (Dec. 2012).

Khalili, M. S. et al., "A Capacitor Cross-Coupled Differential Cascade Low-Noise Amplifier," 2012 IEEE International Conference on Electronics Design, Systems and Applications (ICEDSA), pp. 212-215, doi: 10.1109/ICEDSA.2012.6507799 (2012).

Tran, T.T.N. et al., "A 0.6V High Reverse-Isolation High Gain Single-Stage Non-Cascode Differential CMOS LNA," ResearchGate, 9 pages (Jan. 25, 2015).

Allstot, D.J. et al., "Design considerations for CMOS low-noise amplifiers," 2004 IEE Radio Frequency Integrated Circuits (RFIC) Systems Digest of Papers, pp. 97-100, doi: 10.1109/RFIC.2004.1320538 (2004).

Yang, D. et al., "A 65-nm High-Frequency Low-Noise CMOS-Based RF SoC Technology," in IEEE Transactions on Electron Devices, vol. 57, No. 1, pp. 328-335, doi: 10.1109/TED.2009.2034994 (Jan. 2010).

\* cited by examiner

STACKED FIELD-EFFECT TRANSISTORS WITH A SHIELDED OUTPUT

BACKGROUND

The present disclosure relates to semiconductor device and integrated circuit fabrication and, in particular, to structures including stacked field-effect transistors and methods of forming a structure including stacked field-effect transistors.

Field-effect transistors may be stacked to divide the voltage stress among the different transistors. Stacking allows the use of a larger supply voltage and, therefore, provides a larger output power to a load without increasing the current. Stacked field-effect transistors can also be wired for use in a cascode. Unacceptably high reverse coupling and return loss may occur in stacked field-effect transistors formed using a single active region. In addition, the maximum stable gain may be lower than desirable for a particular application.

Improved structures including stacked field-effect transistors and methods of forming a structure including stacked field-effect transistors are needed.

SUMMARY

In an embodiment of the invention, a structure includes a field-effect transistor having a first active gate, a second active gate, and a drain region that is positioned in a horizontal direction between the first active gate and the second active gate. The structure further includes a back-end-of-line stack having a first metal level and a second metal level over the field-effect transistor. The first metal level includes a first interconnect, a second interconnect, and a third interconnect, and the second metal level includes a fourth interconnect. The third interconnect is connected to the drain region. The third interconnect is positioned in a vertical direction between the fourth interconnect and the drain region, and the third interconnect is positioned in the horizontal direction between the first interconnect and the second interconnect.

In an embodiment of the invention, a method includes forming a field-effect transistor including a first active gate, a second active gate, and a drain region, and forming a back-end-of-line stack including a first metal level and a second metal level over the field-effect transistor. The drain region is positioned in a horizontal direction between the first active gate and the second active gate. The first metal level includes a first interconnect, a second interconnect, and a third interconnect, and the second metal level includes a fourth interconnect. The third interconnect is connected to the drain region. The third interconnect is positioned in a vertical direction between the fourth interconnect and the drain region, and the third interconnect is positioned in the horizontal direction between the first interconnect and the second interconnect.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
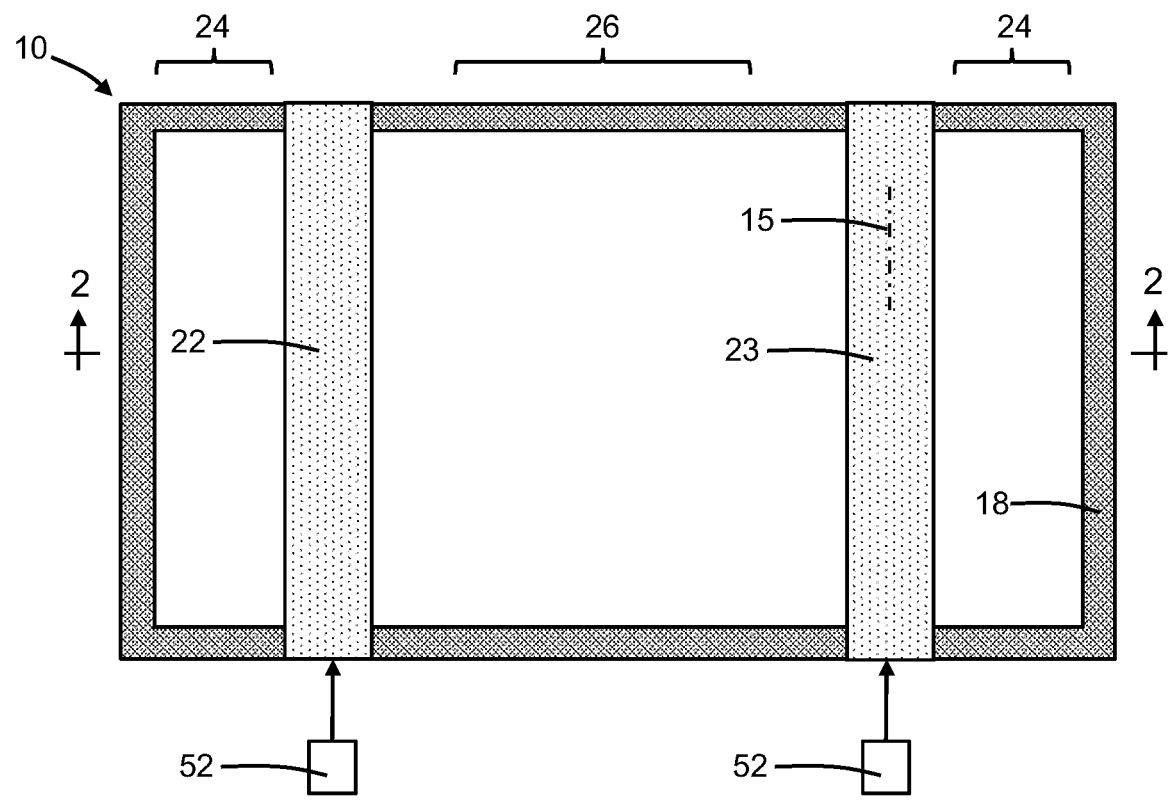
FIG. 1 is a top view of a structure in accordance with embodiments of the invention.
Figure 2:
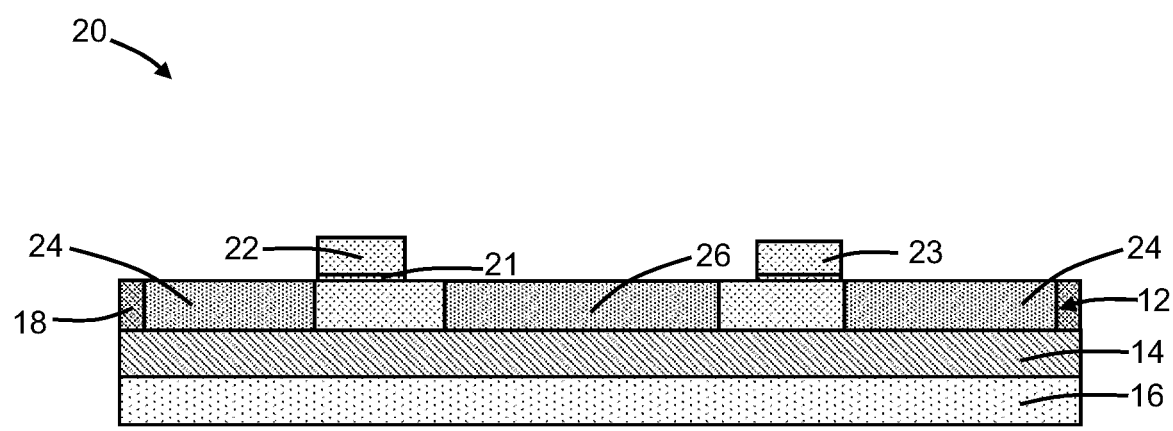
FIG. 2 is a cross-sectional view taken generally along line 2-2 in FIG. 1.

With reference to FIGS. 1, 2 and in accordance with embodiments of the invention, a structure 10 is formed using a silicon-on-insulator (SOI) substrate that includes a device layer 12, a buried oxide (BOX) layer 14 comprised of silicon dioxide, and a handle substrate 16. The device layer 12 is separated from the handle substrate 16 by the intervening buried oxide layer 14 and may be substantially thinner than the handle substrate 16. The device layer 12 is electrically isolated from the handle substrate 16 by the buried oxide layer 14. The device layer 12 and the handle substrate 16 may be comprised of a semiconductor material, such as single-crystal silicon.

A trench isolation region 18 is formed in the device layer 12. In an embodiment, the trench isolation region 18 may penetrate fully through the device layer 12 to the buried oxide layer 14. The trench isolation region 18 surrounds a single active region that is comprised of a portion of the semiconductor material of the device layer 12. The trench isolation region 18 may be formed by a shallow trench isolation technique that patterns trenches in the device layer 12 with lithography and etching processes, deposits a dielectric material to overfill the trenches, and planarizes the dielectric material using chemical mechanical polishing and/or an etch back to remove excess dielectric material from the field. The dielectric material may be comprised of an electrical insulator, such as silicon dioxide, deposited by chemical vapor deposition.

A field-effect transistor 20 may be fabricated by front-end-of-line processing as a device in the active region of the device layer 12. The field-effect transistor 20 may include active gates 22, 23 positioned on the device layer 12, as well as source regions 24 and a drain region 26 formed in the device layer 12. Each of the active gates 22, 23 may be aligned along a longitudinal axis 15. The source regions 24 and drain region 26 may be formed by ion implantation of either a p-type or n-type dopant. A channel region is arranged in the device layer 12 beneath each of the active gates 22, 23 and laterally between each source region 24 and the drain region 26. The active gates 22, 23 may be formed, for example, by patterning a deposited layer of heavily-doped polysilicon with lithography and etching processes. Although not shown, the active gates 22, 23 may define gate fingers that are connected together at one end to provide a joined or unified gate structure for the field-effect transistor 20. The field-effect transistor 20 may include other elements such as a gate dielectric 21 positioned between the active gates 22, 23 and the device layer 12, halo regions and lightly-doped drain extensions in the device layer 12, and sidewall spacers on the active gates 22, 23. Each of the active gates 22, 23 is positioned in a horizontal direction between the drain region 26 and one of the source regions 24. In an embodiment, the active gates 22, 23 may be symmetrically arranged in the horizontal direction relative to the drain region 26.

Figure 3:
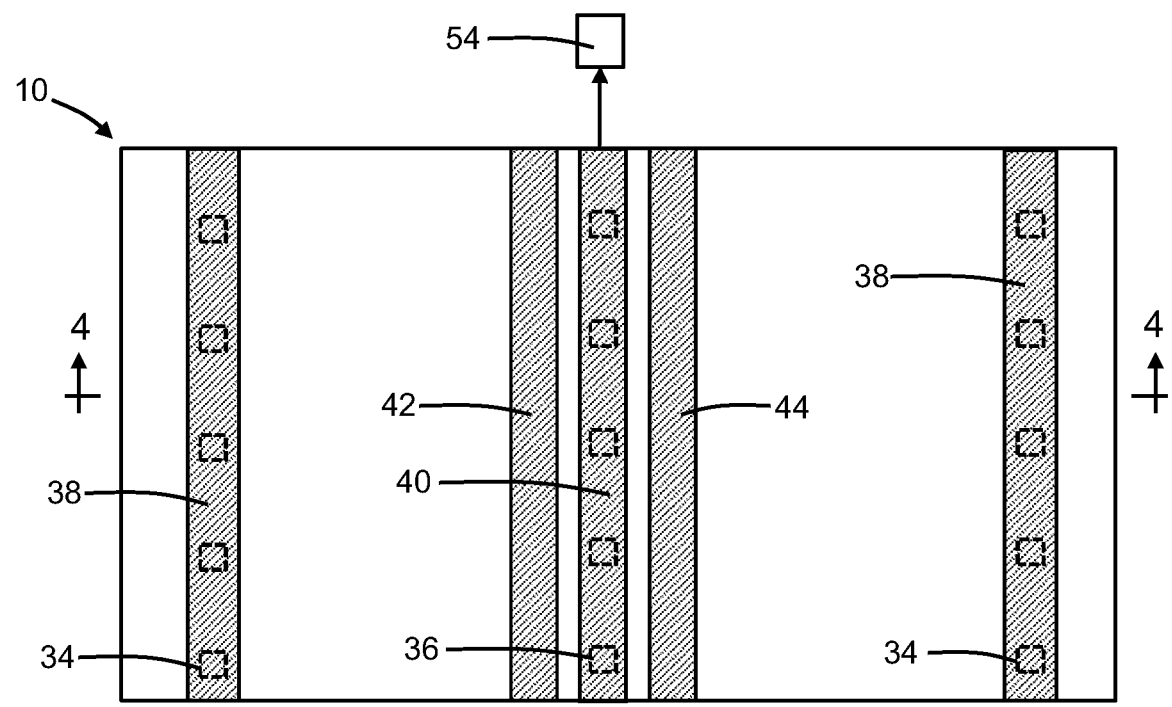
FIG. 3 is a top view of the structure at a fabrication stage subsequent to FIG. 1.
Figure 4:
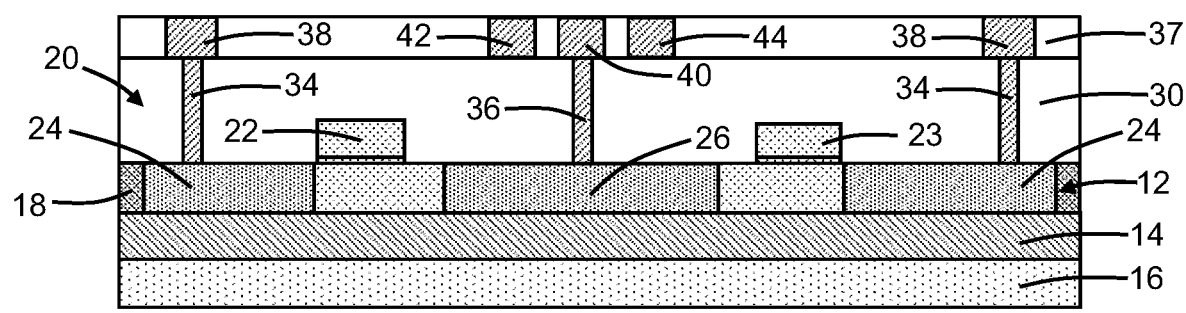
FIG. 4 is a cross-sectional view taken generally along line 4-4 in FIG. 3.

With reference to FIGS. 3, 4 in which like reference numerals refer to like features in FIGS. 1, 2 and at a subsequent fabrication stage of the processing method, a local interconnect structure or contact level is formed by middle-of-line processing over the field-effect transistor 20. The local interconnect structure includes a dielectric layer 30, as well as source contacts 34 and drain contacts 36 that are arranged in the dielectric layer 30. The dielectric layer 30 may be comprised of an insulating material, such as silicon dioxide, and the source contacts 34 and drain contacts 36 may include tungsten, a metal silicide, etc. The source contacts 34 penetrate through the dielectric layer 30 to land at a series of locations on each source region 24. Similarly, the drain contacts 36 penetrate through the dielectric layer 30 to land at a series of locations on the drain region 26.

A dielectric layer 37 and interconnects 38, 40, 42, 44 of a metal level (e.g., a first metal (M1) level) of a back-end-of-line interconnect structure (i.e., a back-end-of-line stack) are formed over the contact level. The metal level including the dielectric layer 37 and interconnects 38, 40, 42, 44 represents the closest metal level of multiple metal levels of the back-end-of-line interconnect structure to the field-effect transistor 20. The dielectric layer 37 may be comprised of an insulating material, such as silicon dioxide, that may be deposited by, for example, chemical vapor deposition. The metal level including the dielectric layer 37 and the interconnects 38, 40, 42, 44 may be formed by deposition, polishing, lithography, and etching techniques characteristic of a damascene process. Specifically, the dielectric layer 37 may be deposited and patterned using lithography and etching processes to define trenches that are filled by a planarized metal (e.g., copper) to define the interconnects 38, 40, 42, 44.

The interconnects 38, 40, 42, 44 may extend lengthwise parallel to the active gates 22, 23. The interconnect 40 is laterally positioned in a horizontal direction between the interconnect 42 and the interconnect 44. The interconnect 42 and the interconnect 44 may be equidistant from the interconnect 40 and, therefore, symmetrically positioned in a horizontal direction relative to the interconnect 40. The interconnects 38 are connected by the source contacts 34 with the source regions 24, and the interconnect 40 is connected by the drain contacts 36 with the drain region 26. The interconnects 42, 44 are not connected by contacts to any portion of the field-effect transistor 20 or to any portion of the single active region surrounded by the trench isolation region 18. In an embodiment, the interconnect 40 may be symmetrically arranged in a horizontal direction between the interconnect 42 and the interconnect 44 such that the lateral spacing between the interconnect 40 and interconnect 42 is equal to the lateral spacing between the interconnect 40 and interconnect 44. In an embodiment, the interconnect 40 may be symmetrically arranged in a horizontal direction between the active gate 22 and the active gate 23. The interconnect 40 is connected to a load 54.

Figure 5:
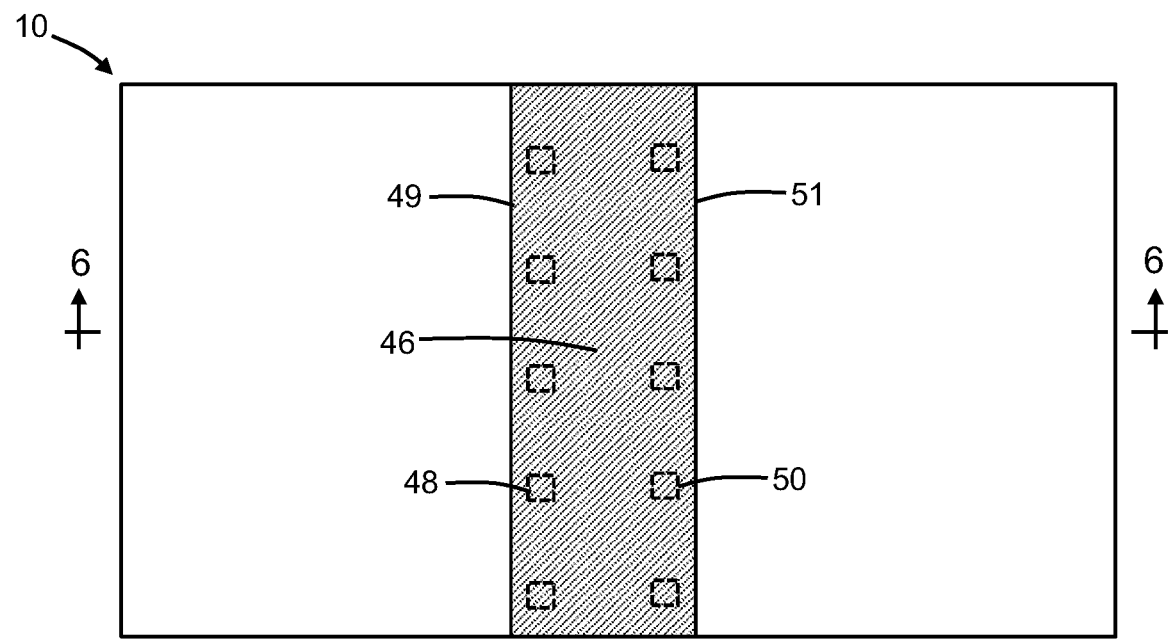
FIG. 5 is a top view of the structure at a fabrication stage subsequent to FIG. 3.
Figure 6:
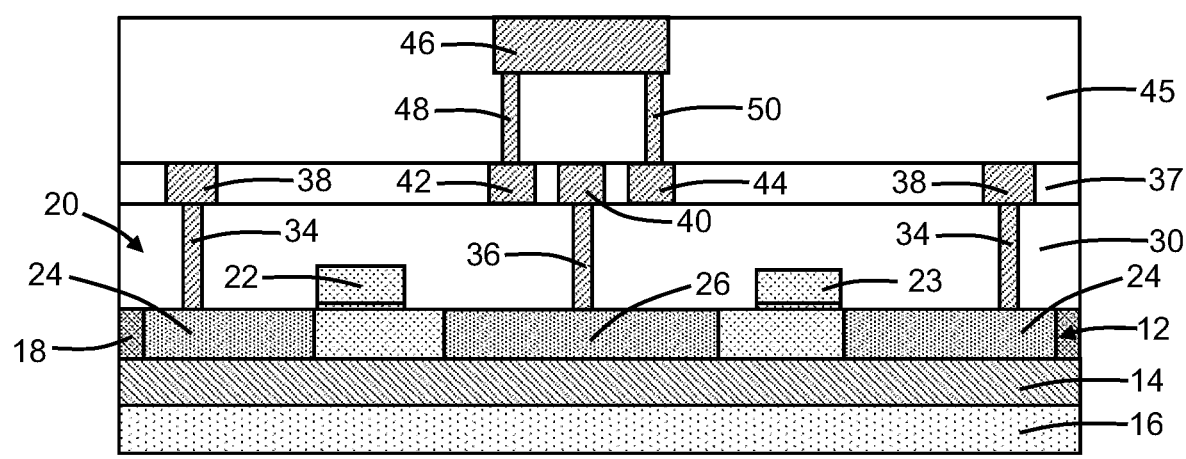
FIG. 6 is a cross-sectional view taken generally along line 6-6 in FIG. 5.

With reference to FIGS. 5, 6 in which like reference numerals refer to like features in FIGS. 3, 4 and at a subsequent fabrication stage of the processing method, a dielectric layer 45 and an interconnect 46 and vias 48, 50 of a metal level (e.g., a second metal (M2) level) of the back-end-of-line interconnect structure are formed over the dielectric layer 37. In the representative embodiment, the metal level including the dielectric layer 45 and interconnect 46 is directly adjacent to the metal level including the dielectric layer 37 and interconnects 38, 40, 42, 44, and the metal level including the dielectric layer 45 and interconnect 46 is separated from the field-effect transistor 20 by the metal level including the dielectric layer 37 and interconnects 38, 40, 42, 44. The dielectric layer 45 may be comprised of a dielectric material, such as silicon dioxide, that may be deposited by, for example, chemical vapor deposition. The metal level including the dielectric layer 45, interconnect 46, and vias 48, 50 may be formed by deposition, polishing, lithography, and etching techniques characteristic of a damascene process. Specifically, the dielectric layer 45 may be deposited and patterned using lithography and etching processes to define a trench and via openings that are filled by a planarized metal (e.g., copper) to define the interconnect 46 and vias 48, 50.

The interconnect 46 may extend lengthwise parallel to the active gates 22, 23 and lengthwise parallel to the interconnects 38, 40, 42, 44 in the lower metal level. The interconnect 46 is connected by the vias 48 with the interconnect 42, and the interconnect 46 is connected by the vias 50 with the interconnect 44. The interconnect 46 has a side edge 49 and a side edge 51 opposite from side edge 49, the interconnect 46 overlaps with the interconnect 42 at the side edge 49, the interconnect 46 overlaps with the interconnect 44 at the side edge 51, the vias 48 are positioned in the horizontal direction adjacent to the side edge 49, and the vias 48 are positioned in the horizontal direction adjacent to the side edge 51. The interconnect 46 bridges laterally across the interconnect 40, the drain contacts 36, and the drain region 26. In an embodiment, the interconnect 46 may be centered over the interconnect 40. The interconnect 40 and drain contacts 36 are positioned in a vertical direction between the interconnect 46 and the drain region 26.

The interconnect 40 is fully enclosed on multiple (e.g., three) sides by the interconnects 42, 44, the interconnect 46, and the vias 48, 50. The interconnects 42, 44, the interconnect 46, and the vias 48, 50, which are electrically floating, define a metal enclosure as a metal shield between the active gates 22, 23 and the interconnect 40. The metal enclosure is not aligned relative to either of the active gates 22, 23. The metal shield may be electrically grounded for reducing reverse coupling and return loss, as well as improving the maximum stable gain.

In an alternative embodiment, the interconnect 46 may be formed at a higher metal level of the back-end-of-line stack, such as the third metal (M3) level, that is not directly adjacent to the metal level including the dielectric layer 37 and interconnects 38, 40, 42, 44.

In use, the driver 52 supplies a radiofrequency signal as an input to the active gates 22, 23 of the field-effect transistor 20. The source regions 24 may be grounded through the interconnects 38. The interconnect 40 may receive the switched radiofrequency signal and output the radiofrequency signal from the stacked field-effect transistor 20 to the load 54. The metal shield defined by the interconnects 42, 44, the interconnect 46, and the vias 48, 50 provides electrical isolation between the active gates 22, 23 and the interconnect 40 at the output from the field-effect transistor 20.

Figure 7:
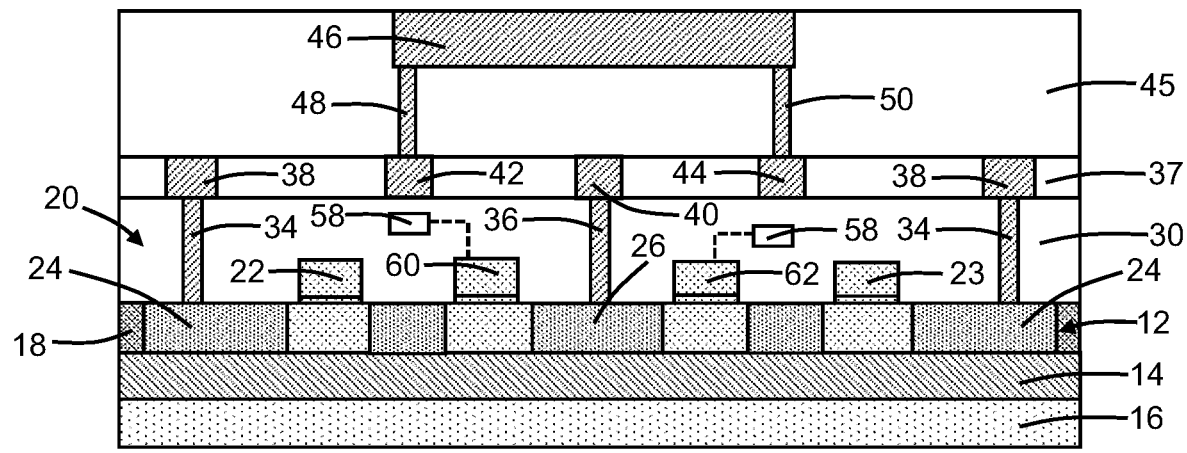
FIG. 7 is a cross-sectional view of a structure in accordance with alternative embodiments of the invention.

With reference to FIG. 7 and in accordance with alternative embodiments, the structure 10 may further includes dummy gates 60, 62 that are laterally arranged between the active gate 22 and the active gate 23. The spacing of the vias 48, 50 and interconnects 42, 44 may be widened to accommodate the introduction of the dummy gates 60, 62. The dummy gates 60, 62 may be longitudinally aligned parallel to the active gates 22. The dummy gate 60 is positioned in a horizontal direction between the interconnect 42 and the interconnect 40, and the dummy gate 62 is positioned in a horizontal direction between the interconnect 44 and the interconnect 40. The dummy gates 60, 62 are not connected with interconnects in the metal level that includes interconnects 40, 42, 44, and the interconnects 42, 44 may be misaligned relative to the dummy gates 60, 62. The dummy gates 60, 62 may be biased, during operation, to alternating current (AC) ground, but are not active features associated with the field-effect transistor 20 or its operation. In that regard, the dummy gates 60, 62 may be connected to a power supply 58 configured to supply a direct current (DC) bias voltage to the dummy gates 60, 62 that ensures that the dummy gates 60, 62 do not interfere with the operation of the field-effect transistor 20.

Figure 8:
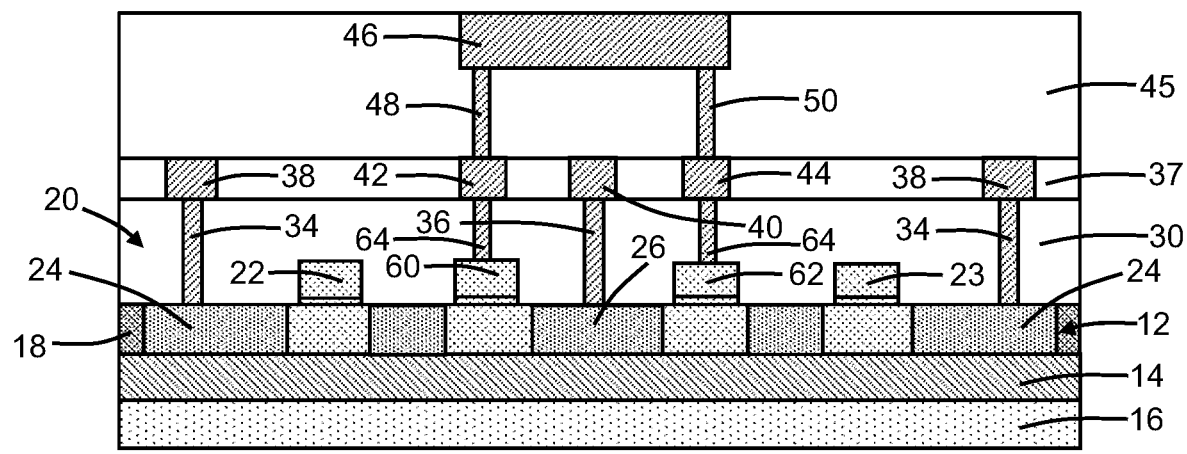
FIG. 8 is a cross-sectional view of a structure in accordance with alternative embodiments of the invention.

With reference to FIG. 8 in which like reference numerals refer to like features in FIG. 7 and in accordance with alternative embodiments, the interconnects 42, 44 may be aligned relative to the dummy gates 60, 62 and connected to the dummy gates 60, 62 by contacts 64 in a contact-over-active-gate scheme. In particular, the interconnect 42 may overlap with the dummy gate 60 to facilitate the connection to the dummy gate 60, and the interconnect 44 may overlap with the dummy gate 62 to facilitate the connection to the dummy gate 62.

Figure 9:
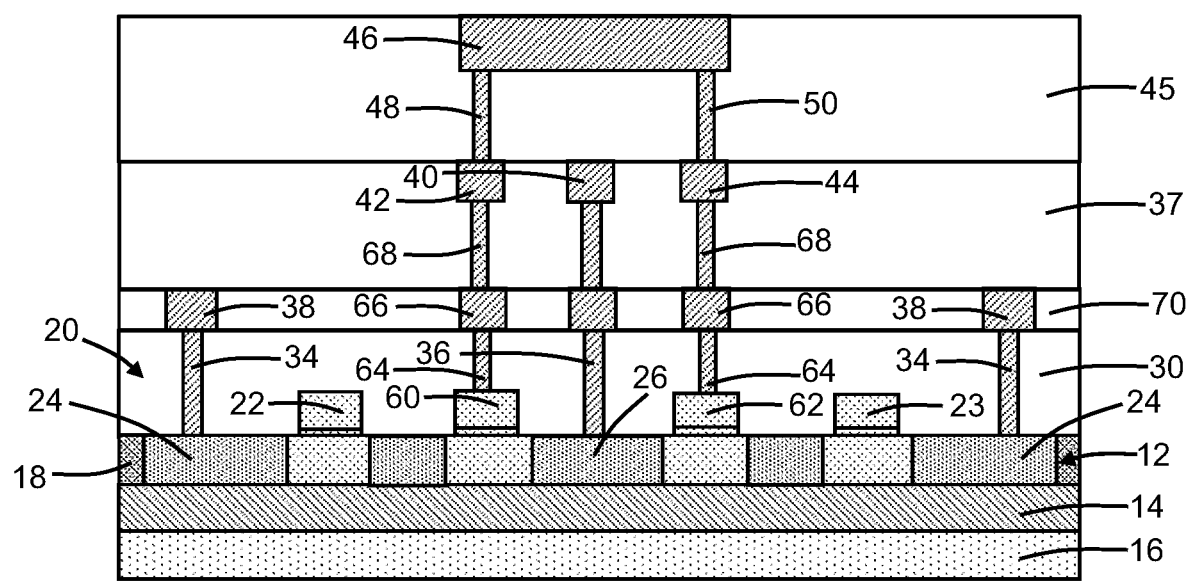
FIG. 9 is a cross-sectional view of a structure in accordance with alternative embodiments of the invention.

With reference to FIG. 9 in which like reference numerals refer to like features in FIG. 8 and in accordance with alternative embodiments, an additional metal level may be positioned between the field-effect transistor 20 and the metal level including the interconnects 40, 42, 44. Additional interconnects 66 may be formed in a dielectric layer 70 and connected by the contacts 64 to the dummy gates 60, 62. The interconnects 66 may be respectively connected by vias 68 to the interconnects 40, 42, 44. The interconnects 66 connected to the interconnects 42, 44 may participate in the metal enclosure surrounding the interconnect 40 to define the metal shield.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a field-effect transistor including a first active gate, a second active gate, and a drain region, the drain region positioned in a horizontal direction between the first active gate and the second active gate; and
    a back-end-of-line stack including a first metal level and a second metal level over the field-effect transistor, the first metal level including a first interconnect, a second interconnect, and a third interconnect, the second metal level including a fourth interconnect, the third interconnect connected to the drain region, the third interconnect positioned in a vertical direction between the fourth interconnect and the drain region, and the third interconnect positioned in the horizontal direction between the first interconnect and the second interconnect.

2. The structure of claim 1 wherein the first metal level is closer to the field-effect transistor than the second metal level.

3. The structure of claim 1 wherein the second metal level includes a first via directly connecting the fourth interconnect to the first interconnect and a second via directly connecting the fourth interconnect to the second interconnect.

4. The structure of claim 3 wherein the fourth interconnect includes a first side edge and a second side edge opposite to the first side edge, the first via is positioned in the horizontal direction adjacent to the first side edge, and the second via is positioned in the horizontal direction adjacent to the second side edge.

5. The structure of claim 1 wherein the fourth interconnect includes a first side edge and a second side edge opposite to the first side edge, the fourth interconnect overlaps with the first interconnect at the first side edge, and the fourth interconnect overlaps with the second interconnect at the second side edge.

6. The structure of claim 1 further comprising:
a first dummy gate; and
a second dummy gate,
wherein the first dummy gate is positioned in the horizontal direction between the first active gate and the drain region, and the second dummy gate is positioned in the horizontal direction between the second active gate and the drain region.

7. The structure of claim 6 further comprising:
a contact level vertically positioned between the first metal level and the field-effect transistor, the contact level including a first contact directly connecting the first interconnect to the first dummy gate, and the contact level including a second contact directly connecting the second interconnect to the second dummy gate.

8. The structure of claim 7 wherein the first interconnect overlaps with the first dummy gate, and the second interconnect overlaps with the second dummy gate.

9. The structure of claim 7 wherein the contact level includes a third contact directly connecting the third interconnect to the drain region.

10. The structure of claim 6 wherein the first interconnect is positioned in the horizontal direction between the first active gate and the first dummy gate, and the second interconnect is positioned in the horizontal direction between the second active gate and the second dummy gate.

11. The structure of claim 6 further comprising:
a power supply connected to the first dummy gate and the second dummy gate, the power supply configured to supply a direct current bias voltage to the first dummy gate and the second dummy gate.

12. The structure of claim 1 wherein the field-effect transistor includes a single active region of semiconductor material, a first source region in the single active region, and a second source region in the single active region, the drain region is located in the single active region, the first active gate is laterally positioned between the first source region and the drain region, and the second active gate is positioned in the horizontal direction between the second source region and the drain region.

13. The structure of claim 1 wherein the third interconnect is symmetrically arranged in the horizontal direction between the first interconnect and the second interconnect.

14. The structure of claim 1 wherein the first active gate and the second active gate are symmetrically positioned in the horizontal direction relative to the drain region.

15. A method comprising:
forming a field-effect transistor including a first active gate, a second active gate, and a drain region, wherein the drain region is positioned in a horizontal direction between the first active gate and the second active gate; and
forming a back-end-of-line stack including a first metal level and a second metal level over the field-effect transistor, wherein the first metal level includes a first interconnect, a second interconnect, and a third interconnect, the second metal level includes a fourth interconnect, the third interconnect is connected to the drain region, the third interconnect is positioned in a vertical direction between the fourth interconnect and the drain region, and the third interconnect is positioned in the horizontal direction between the first interconnect and the second interconnect.

16. The method of claim 15 wherein the second metal level includes a first via directly connecting the fourth interconnect to the first interconnect and a second via directly connecting the fourth interconnect to the second interconnect.

17. The method of claim 15 wherein the fourth interconnect includes a first side edge and a second side edge opposite to the first side edge, the fourth interconnect overlaps with the first interconnect at the first side edge, and the fourth interconnect overlaps with the second interconnect at the second side edge.

18. The method of claim 15 further comprising:
forming a first dummy gate and a second dummy gate,
wherein the first dummy gate is positioned in the horizontal direction between the first active gate and the drain region, and the second dummy gate is positioned in the horizontal direction between the second active gate and the drain region.

19. The method of claim 18 further comprising:
forming a contact level vertically positioned between the first metal level and the field-effect transistor, the contact level including a first contact directly connecting the first interconnect to the first dummy gate, and the contact level including a second contact directly connecting the second interconnect to the second dummy gate.

20. The method of claim 15 wherein the field-effect transistor includes a single active region of semiconductor material, a first source region in the single active region, and a second source region in the single active region, the drain region is located in the single active region, the first active gate is laterally positioned between the first source region and the drain region, and the second active gate is positioned in the horizontal direction between the second source region and the drain region.

* * * * *